US008753937B2

(12) United States Patent
Lin et al.

(10) Patent No.: US 8,753,937 B2
(45) Date of Patent: Jun. 17, 2014

(54) MANUFACTURING METHOD OF POWER TRANSISTOR DEVICE WITH SUPER JUNCTION

(75) Inventors: Yung-Fa Lin, Hsinchu (TW); Shou-Yi Hsu, Hsinchu County (TW); Meng-Wei Wu, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/553,806

(22) Filed: Jul. 19, 2012

(65) Prior Publication Data

US 2013/0210205 A1 Aug. 15, 2013

(30) Foreign Application Priority Data

Feb. 14, 2012 (TW) ............................ 101104734 A

(51) Int. Cl.
*H01L 21/8236* (2006.01)

(52) U.S. Cl.
USPC .................... 438/276; 438/542; 257/E21.056

(58) Field of Classification Search
CPC .............. H01L 21/265; H01L 29/0634; H01L 29/1095; H01L 21/26586; H01L 29/7802; H01L 29/66712; H01L 29/0878; H01L 29/4236
USPC .................. 257/302, 328, 325, 329, E21.417, 257/E21.418, E21.629, E29.256, E29.257, 257/E29.262, E21.056, E21.058, E21.14, 257/E21.419, E21.42; 438/138, 268, 206, 438/276, 542, 293, 524
See application file for complete search history.

(56) References Cited

U.S. PATENT DOCUMENTS

| | | | | |
|---|---|---|---|---|
| 6,184,555 | B1 * | 2/2001 | Tihanyi et al. | 257/342 |
| 6,576,516 | B1 * | 6/2003 | Blanchard | 438/268 |
| 6,608,350 | B2 * | 8/2003 | Kinzer et al. | 257/341 |
| 6,689,662 | B2 * | 2/2004 | Blanchard | 438/268 |
| 6,821,824 | B2 * | 11/2004 | Minato et al. | 438/138 |
| 6,982,193 | B2 * | 1/2006 | Hossain et al. | 438/135 |
| 7,381,603 | B2 * | 6/2008 | Hossain et al. | 438/197 |
| 7,867,854 | B2 * | 1/2011 | Lin et al. | 438/270 |
| 7,943,452 | B2 * | 5/2011 | Li et al. | 438/199 |
| 8,067,800 | B2 * | 11/2011 | Hsieh | 257/331 |
| 8,178,410 | B1 * | 5/2012 | Lin et al. | 438/276 |
| 8,304,312 | B2 * | 11/2012 | Hebert | 438/268 |
| 8,373,225 | B2 * | 2/2013 | Hsieh | 257/331 |
| 8,404,531 | B2 * | 3/2013 | Lin et al. | 438/192 |
| 8,435,865 | B2 * | 5/2013 | Kodama | 438/401 |

(Continued)

FOREIGN PATENT DOCUMENTS

| | | |
|---|---|---|
| TW | 200921798 | 5/2009 |
| TW | 201011835 | 3/2010 |

*Primary Examiner* — Marvin Payen
*Assistant Examiner* — Victor Barzykin
(74) *Attorney, Agent, or Firm* — Winston Hsu; Scott Margo

(57) ABSTRACT

The present invention provides a manufacturing method of a power transistor device. First, a semiconductor substrate of a first conductivity type is provided, and at least one trench is formed in the semiconductor substrate. Next, the trench is filled with a dopant source layer, and a first thermal drive-in process is performed to form two doped diffusion regions of a second conductivity type in the semiconductor substrate, wherein the doping concentration of each doped diffusion region close to the trench is different from the one of each doped diffusion region far from the trench. Then, the dopant source layer is removed and a tilt-angle ion implantation process and a second thermal drive-in process are performed to adjust the doping concentration of each doped diffusion region close to the trench.

14 Claims, 6 Drawing Sheets

(56) References Cited

U.S. PATENT DOCUMENTS

2005/0181558 A1* 8/2005 Hshieh .......................... 438/248
2005/0181564 A1* 8/2005 Hshieh et al. ................. 438/270
2010/0044791 A1* 2/2010 Hebert .......................... 257/341
2011/0001187 A1* 1/2011 Hebert .......................... 257/330
2011/0147836 A1* 6/2011 Hebert .......................... 257/334
2011/0227147 A1* 9/2011 Li et al. ......................... 257/329
2012/0064684 A1* 3/2012 Hsieh ............................ 438/270
2013/0075741 A1* 3/2013 Mallikarjunaswamy et al. ............................... 257/66
2013/0075746 A1* 3/2013 Mallikarjunaswamy et al. ............................... 257/75
2013/0134487 A1* 5/2013 Lin et al. ....................... 257/288

* cited by examiner

MANUFACTURING METHOD OF POWER TRANSISTOR DEVICE WITH SUPER JUNCTION

BACKGROUND OF THE INVENTION

1. Field of the Invention

The present invention relates generally to a manufacturing method of a power transistor device with a super junction, more particularly, to a manufacturing method of a power transistor device with a super junction for adjusting the doping concentration of the super junction close to the sidewall of trench.

2. Description of the Prior Art

In power transistor devices, the ON resistance (RDS(on)) between the drain and the source is proportional to the power consumption of the device, so an effective way to reduce the power consumption of the power transistor device is to lower the RDS(on). In power transistor devices, the resistance provided by the epitaxial layer used for withstanding high voltage is the main contribution to the RDS(on). Although increasing the doping concentration of the conductive material in the epitaxial layer can reduce the resistance, the breakdown voltage of the epitaxial layer will also be lowered, thereby degrading the capacity of the power transistor device to withstand high voltages.

To maintain or increase the voltage withstanding ability of the power transistor device and to lower the resistance of the epitaxial layer, a power transistor device with super junction which has high voltage withstanding ability and low ON resistance has been developed in the industry. A conventional method of manufacturing a power transistor device is to form an N-type epitaxial layer on an N-type substrate, and an etching process is then performed on the N-type epitaxial layer to form a plurality of deep trenches. A dopant source layer is then filled into each deep trench and a high-temperature diffusion method is performed to diffuse P-type dopants in the dopant source layer into the N-type epitaxial layer so as to form a P-type doped region, wherein the N-type epitaxial layer and the P-type doped region constitute a P-N junction, i.e. the super junction, which is perpendicular to the substrate. However, the P-type doped region is formed by diffusion, thus the doping concentration will become higher when the doped region is closer to the sidewall of the deep trench. For this reason, the doping concentration of the surface of P-type doped region is prone to over high, resulting in a non-uniform distribution of the hole and electron concentration in the super junctions and poor voltage withstanding ability of the super junctions.

In view of this matter, the main objective of the industry in the current stage is to lower the doping concentration of the surface of the doped region used to form the super junction, so as to solve the problem of non-uniform distribution of hole and electron concentration in conventional super junction structures.

SUMMARY OF THE INVENTION

The main purpose of present invention is to provide a manufacturing method of a power transistor device with a super junction in order to solve the problem of non-uniform distribution of hole concentration and electron concentration in conventional super junction structures.

To achieve the purpose, the present invention provides a manufacturing method of a power transistor device with a super junction. First, a semiconductor substrate of a first conductivity type is provided. Then, at least one trench is formed in the semiconductor substrate. Next, a dopant source layer is filled into the trench, wherein the dopant source layer includes a plurality of dopants of a second conductivity type different from the first conductivity type. Then, a first thermal drive-in process is performed to diffuse the dopants into the semiconductor substrate, so as to form two doped diffusion regions respectively in the semiconductor substrate at both sides of the trench, wherein the doping concentration of each doped diffusion region close to the sidewall of the trench is different from the doping concentration of each doped diffusion region far from the sidewall of the trench. Next, the dopant source layer is removed. A tilt-angle ion implantation and a second thermal drive-in process are then performed to adjust the doping concentration of each doped diffusion region close to the sidewall of the trench.

To achieve this purpose, the present invention further provides a manufacturing method of a power transistor device with a super junction. First, a semiconductor substrate of a first conductivity type is provided. Next, at least one trench is formed in the semiconductor substrate. Then, a first dopant source layer is filled into the trench, wherein the first dopant source layer includes first dopants of a second conductivity type different from the first conductivity type. Next, a first thermal drive-in process is performed to diffuse the first dopants into the semiconductor substrate, so as to form two doped diffusion regions in the semiconductor substrate respectively at both sides of the trench, wherein the doping concentration of each doped diffusion region close to the sidewall of the trench is different from the doping concentration of each doped diffusion region far from the sidewall of the trench. Next, the first dopant source layer is removed. A doping concentration adjusting layer is then filled into the trench and a second thermal drive-in process is performed to adjust the doping concentration of each doped diffusion region close to the sidewall of the trench. Afterwards, the doping concentration adjusting layer is removed.

The present invention uses tilt-angle ion implantation process or the doping concentration adjusting layer filled in the trench, combining with the thermal drive-in process, to adjust the doping concentration of each doped diffusion region close to each trench, so that the super junction constituted by each doped diffusion region and N-type doped diffusion region may have an uniform distribution ratio of hole concentration and electron concentration, thereby solving the problem of poor voltage withstanding ability of conventional super junctions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
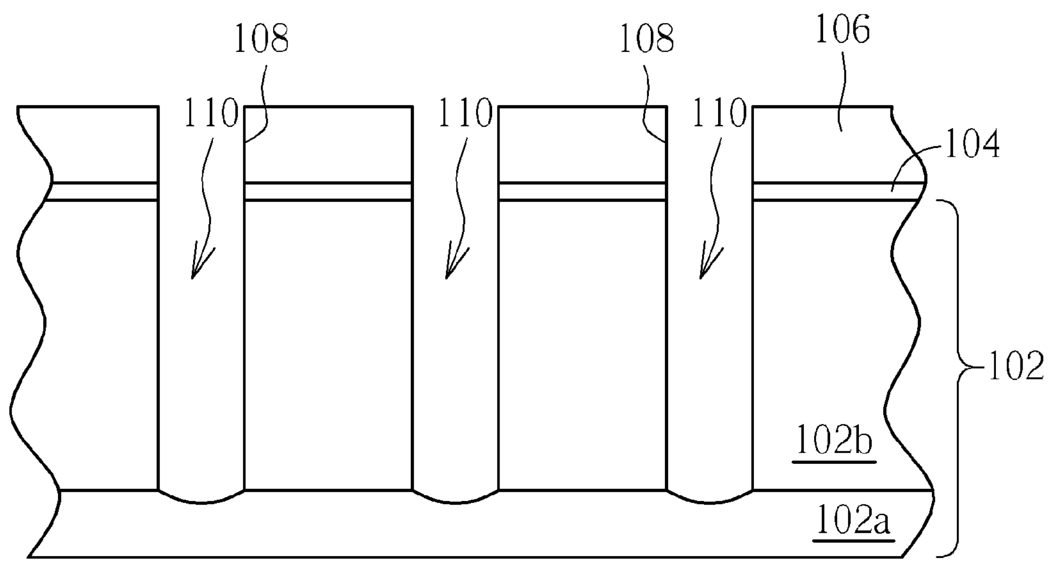
FIGS. 1-8 are schematic views illustrating the manufacturing method of a power transistor device in accordance with the first embodiment of the present invention.

Please refer to FIGS. 1-8, which are schematic views illustrating the manufacturing method of a power transistor device in accordance with the first embodiment of present invention. First, as shown in FIG. 1, a semiconductor substrate of a first conductivity type is provided. Next, a pad layer 104, ex. a silicon dioxide ($SiO_2$) layer, is formed on the semiconductor substrate 102, but not limited thereto. A deposition process is then performed to form a hard mask layer 106, ex. a silicon nitride ($Si_3N_4$) layer, on the pad layer 104. Next, a photolithographic process and an etching process are performed to pattern the pad layer 104 and the hard mask layer 106, so as to form a plurality of openings 108 penetrating through the hard mask layer 106 and the pad layer 104 and exposing the semiconductor substrate 102. Then, an etching process using the hard mask layer 106 as a mask is performed via each opening 108 to form a plurality of trenches 110 in the semiconductor substrate 102. In this embodiment, the semiconductor substrate 102 may include a substrate 102*a*, such as a silicon wafer, and an epitaxial layer 102*b* disposed on the substrate 102*a*. Moreover, each trench 110 penetrates through the epitaxial layer 102*b* and exposes the substrate 102*a*, but not limited thereto. Alternatively, the trench 110 may not penetrate through the entire epitaxial layer 102*b*. Besides, the number of openings 108 or trenches 110 in the present invention is not limited to be a plurality, they may be single ones instead.

Figure 2:
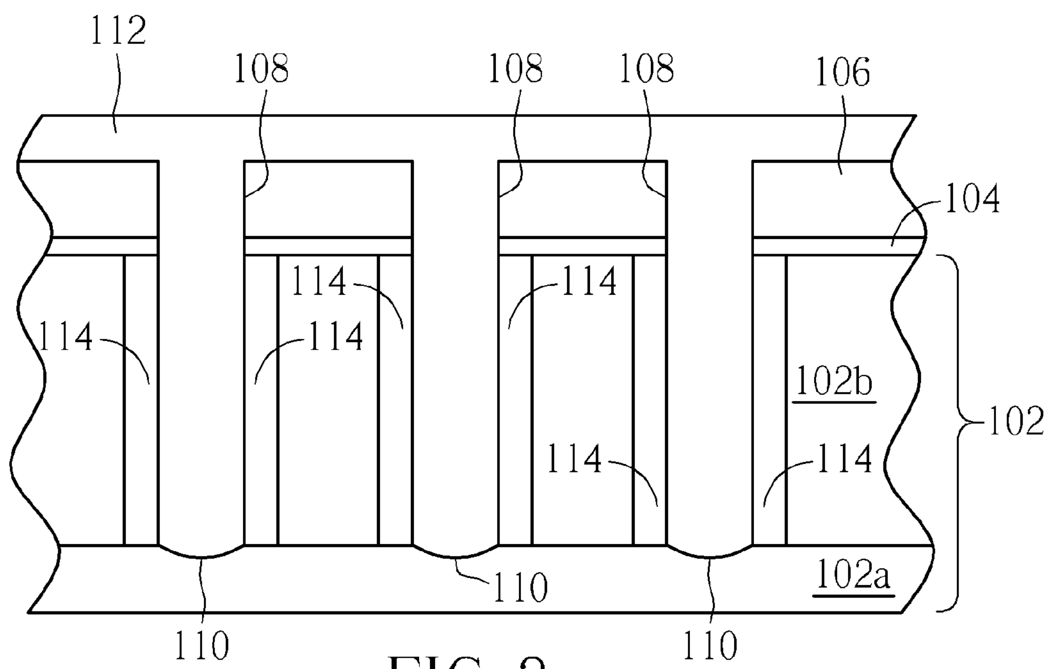

Next, as shown in FIG. 2, a first dopant source layer 112 is filled into each trench 110 and covering the hard mask layer 106, wherein the first dopant source layer 112 includes a plurality of first dopants of a second conductivity type different from the first conductivity type. Then, a first thermal drive-in process is performed to diffuse the first dopants of the second conductivity type into the semiconductor substrate 102, so as to form two doped diffusion regions 114 in the semiconductor substrate 102 respectively at two sides of each trench 110, wherein the doping concentration of each doped diffusion region 114 close to the sidewall of each trench 110 is different from the doping concentration of each doped diffusion region 114 far from the sidewall of each trench 110. In this embodiment, since the doped diffusion region 114 is formed by thermally diffusing the first dopants, the doped diffusion region 114 will be of the second conductivity type, and the doping concentration of each doped diffusion region 114 will be higher as it is closer to the dopant source layer 112. That is, the doping concentration of each doped diffusion region 114 close to the sidewall of each trench 110 is higher than the doping concentration of each doped diffusion region 114 far from the sidewall of each trench 110, but not limited thereto. Moreover, the first conductivity type is N-type and the second conductivity type is P-type, but not limited thereto. The first conductivity type and the second conductivity type may be interchanged. Besides, the material for forming the first dopant source layer 112 may include boron-silicate glass (BSG), but not limited thereto. The material of the first dopant source layer 112 in present invention may be decided by the conductivity type of the doped diffusion region 114 to be formed. For example, the material of the first dopant source layer may include boron-silicate glass (BSG) when the second conductivity type is P-type. The material of the first dopant source layer may include arsenic silicate glass (ASG) or phosphor silicate glass (PSG) when the second conductivity type is N-type. In other embodiment of present invention, the method of forming the P-type doped diffusion region may include the step of performing a P-type ion implantation process to implant P-type first dopants into the N-type semiconductor substrate and then performing a first thermal drive-in process to form the P-type doped diffusion region.

Figure 3:
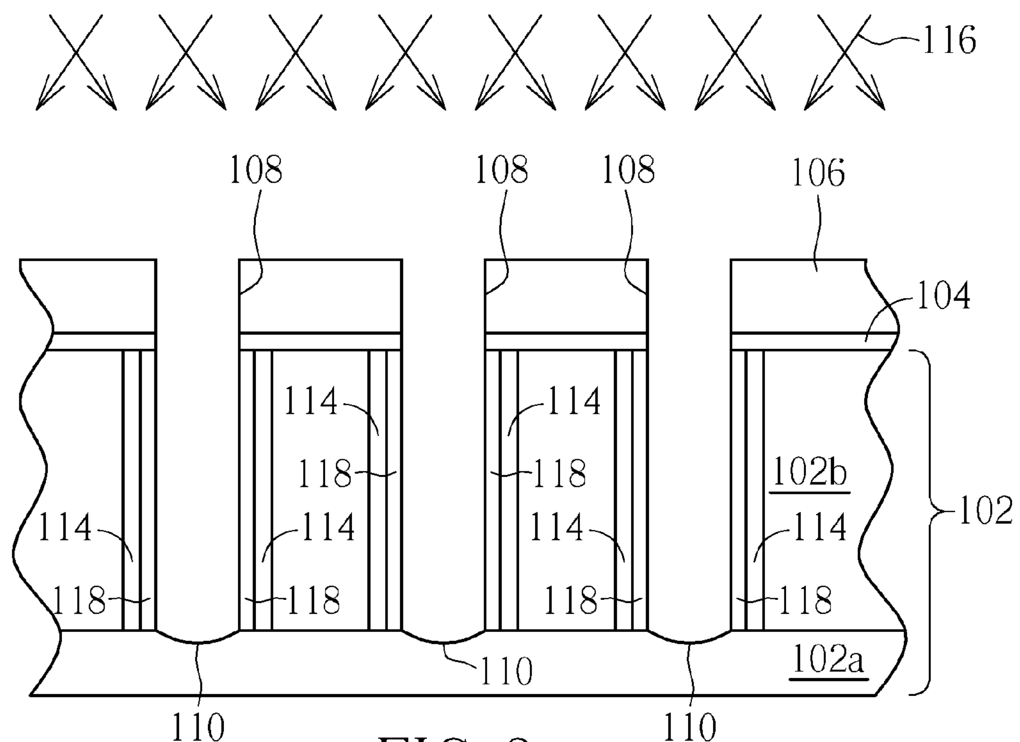

Afterwards, as shown in FIG. 3, another etching process is performed to remove the first dopant source layer 112. A tilt-angle ion implantation process 116 is then performed to implant a plurality of second dopants into each P-type doped diffusion region 114 close to the sidewall of each trench 110. Next, a second thermal drive-in process is performed to uniformly diffuse the second dopants, so as to adjust the doping concentration of each P-type doped diffusion region 114 close to the sidewall of each trench 110. In this embodiment, the conductivity type of the tilt-angle ion implantation process is of N-type for implanting the N-type second dopants. Therefore, a concentration adjusting region 118 will be formed in each P-type doped diffusion region 114 close to the sidewall of each trench 110. Since the conductivity type of N-type second dopants implanted into each P-type doped diffusion region 114 is different from the one of the P-type first dopants in each P-type doped diffusion region 114, the N-type second dopants will neutralize a part of the P-type first dopant of each P-type doped diffusion region 114 in each concentration adjusting region 118, so that the doping concentration of the P-type first dopant in each concentration adjusting region 118 may be adjusted to a level close to the doping concentration of the P-type first dopant in each P-type doped diffusion region 114. Through this mechanism, when the doping concentration of each P-type doped diffusion region 114 close to the sidewall of each trench 110 is too high, the doping concentration of each P-type doped diffusion region 114 close to the sidewall of each trench 110 will be lowered to the level close to the doping concentration of the other region of each P-type doped diffusion region 114. Therefore, the P-N junction, i.e. the super junction, constructed by each P-type doped diffusion region 114 and each N-type semiconductor substrate 102 perpendicular to the N-type semiconductor substrate 102 may have an uniform distribution ratio of hole concentration and electron concentration, thereby solving the problem of poor voltage withstanding ability of conventional super junction.

Figure 4:
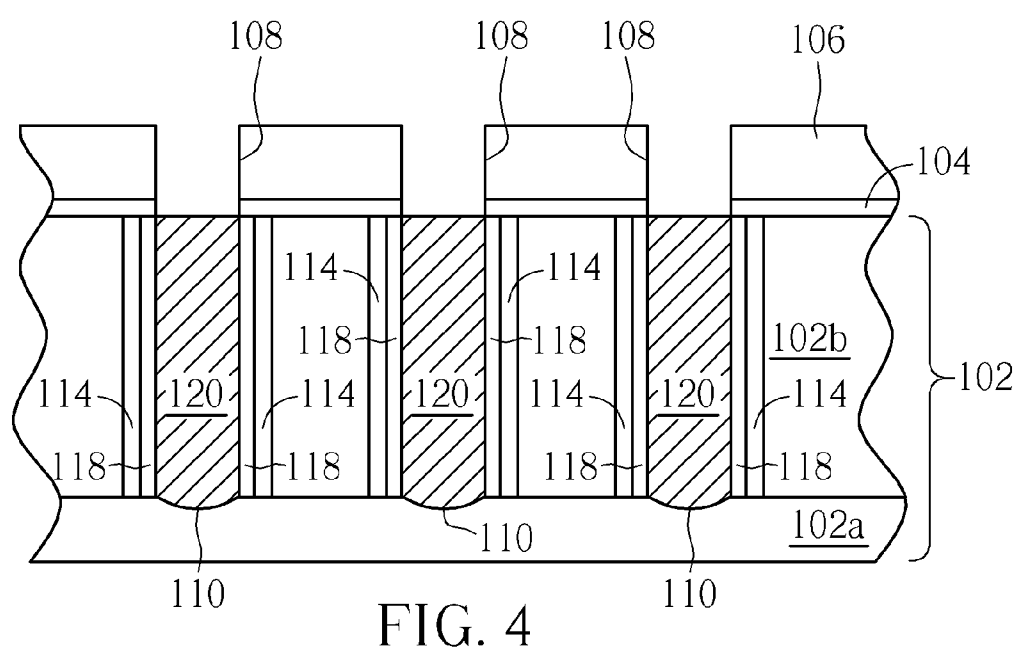

After the N-type tilt-angle ion implantation process 116 and the second thermal drive-in process, as shown in FIG. 4, another deposition process is performed to form an insulating material layer, ex. a silicon dioxide layer, on the hard mask layer 106, and the formed insulating material layer fills up each trench 110. Then, a chemical mechanical polishing (CMP) process is performed to remove the insulating material layer on the hard mask layer 106. Next, another etching process is performed to remove the insulating material layer in the opening 108, so as to form an insulating layer 120 in each trench 110. In this embodiment, the upper surface of the insulating layer 120 is roughly leveled with the upper surface of the pad layer 104, but not limited thereto. The upper surface of the insulating layer 120 may also be leveled between the upper surface of the pad layer 104 and the upper surface of the N-type semiconductor substrate 102, or be leveled with the upper surface of the N-type semiconductor substrate 102.

Figure 5:
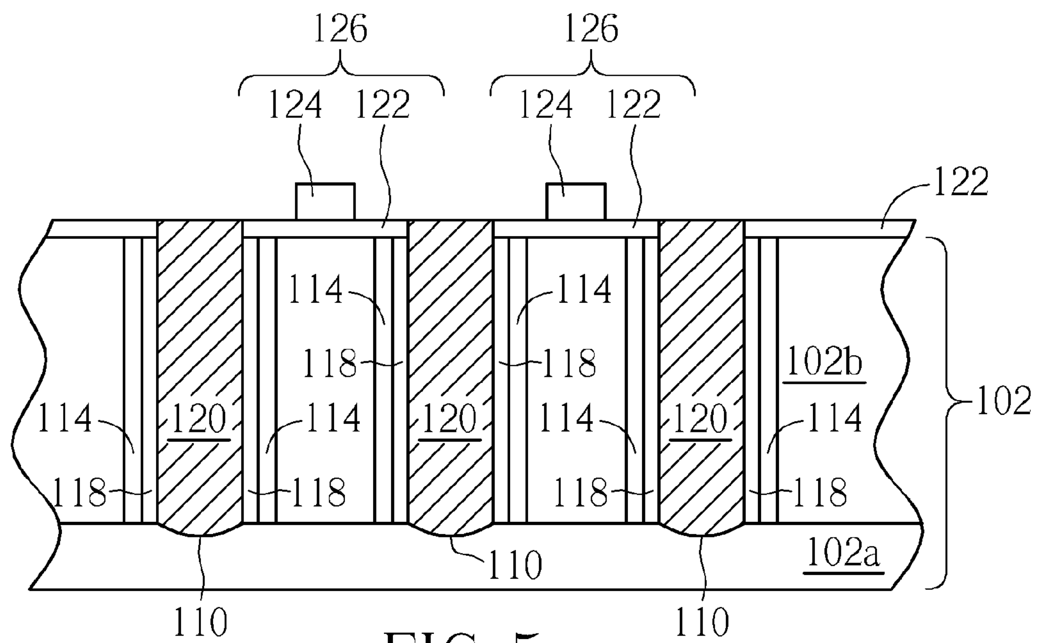

Afterwards, as shown in FIG. 5, the hard mask layer 106 and the pad layer 104 are removed to expose the N-type semiconductor substrate 102. Next, a thermal oxidation process is performed to form a gate insulator layer 122 on the N-type semiconductor substrate 102. A conductive material layer, such as polysilicon layer, is then covered on the gate insulator layer 122 and the insulating layer 120. Next, another photolithographic process and etching process are performed to pattern the conductive material layer, so as to form a gate conductive layer 124 on the N-type semiconductor substrate 102 between two adjacent trenches 110. The gate conductive layer 124 serves as the gate of a power transistor device, and each gate conductive layer 124 and each gate insulator layer 122 between each gate conductive layer 124 and the N-type semiconductor substrate 102 may constitute a gate structure 126. In this embodiment, the upper surface of the gate insulator layer 122 is roughly leveled with the upper surface of the insulating layer 120, but not limited thereto. In other embodiments of present invention, the number of gate structures may only be one, and the gate structure may be formed on the N-type semiconductor substrate at only one side of one of the trenches.

Figure 6:
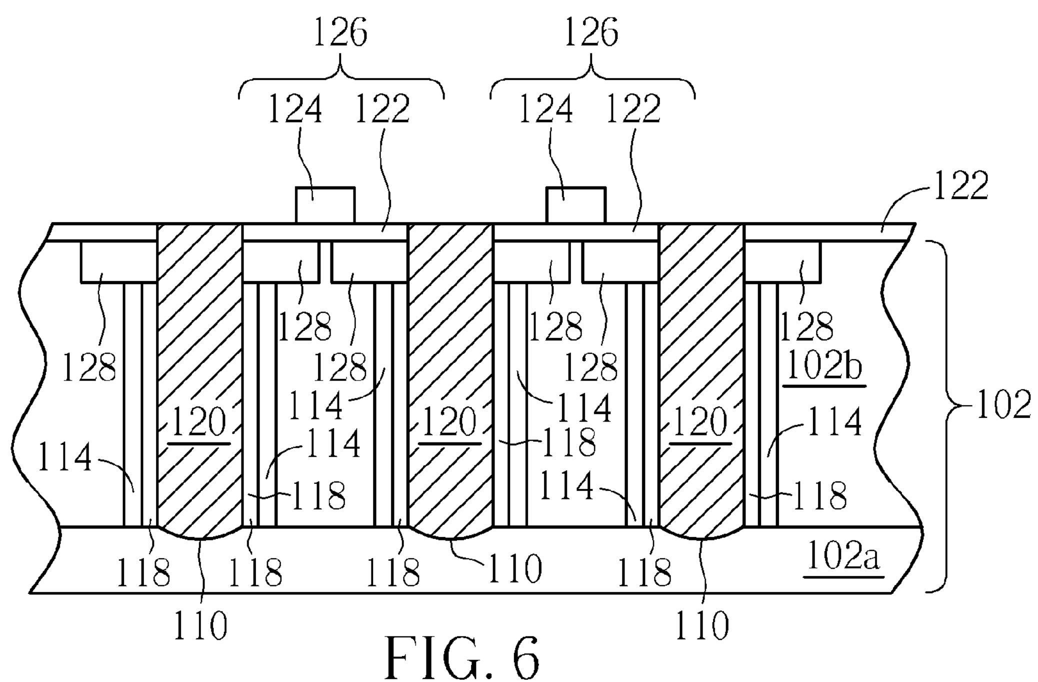

Next, as shown in FIG. 6, the gate conductive layer 124 is used as a mask to perform a P-type ion implantation process and another thermal drive-in process, so as to form two P-type doped base regions 128 in the N-type semiconductor substrate 102 respectively at two sides of each gate structure 126. Each P-type doped base region 128 contacts the P-type doped diffusion region 114 and the P-type concentration adjusting region 118 and is partially overlapped with each gate structure 126 to serve as the base of a power transistor device.

Figure 7:
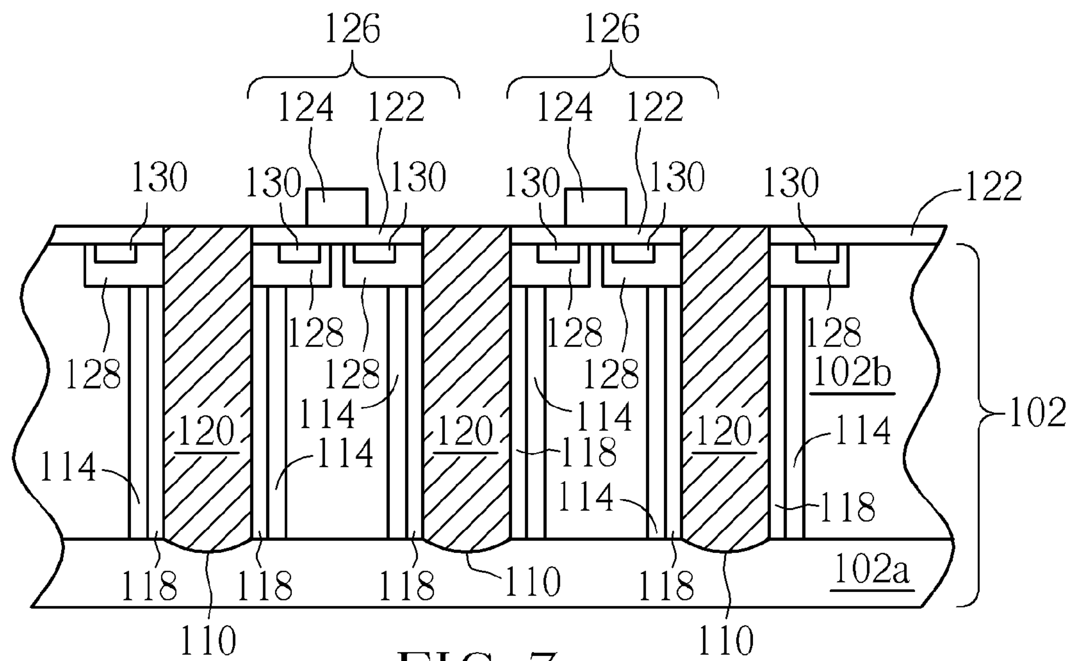

Afterwards, as shown in FIG. 7, an N-type ion implantation process and another thermal drive-in process are performed with a mask (not shown) to form an N-type doped source region 130 in each P-type doped base region 128. The N-type doped source region 130 is partially overlapped with the gate structure 126 to serve as the source of a power transistor device. The number of gate structure 126, the P-type doped base region 128, or the N-type doped source region 130 of present invention is not limited to be a plurality. They may be single ones and may be modified according to the practical requirements.

Figure 8:
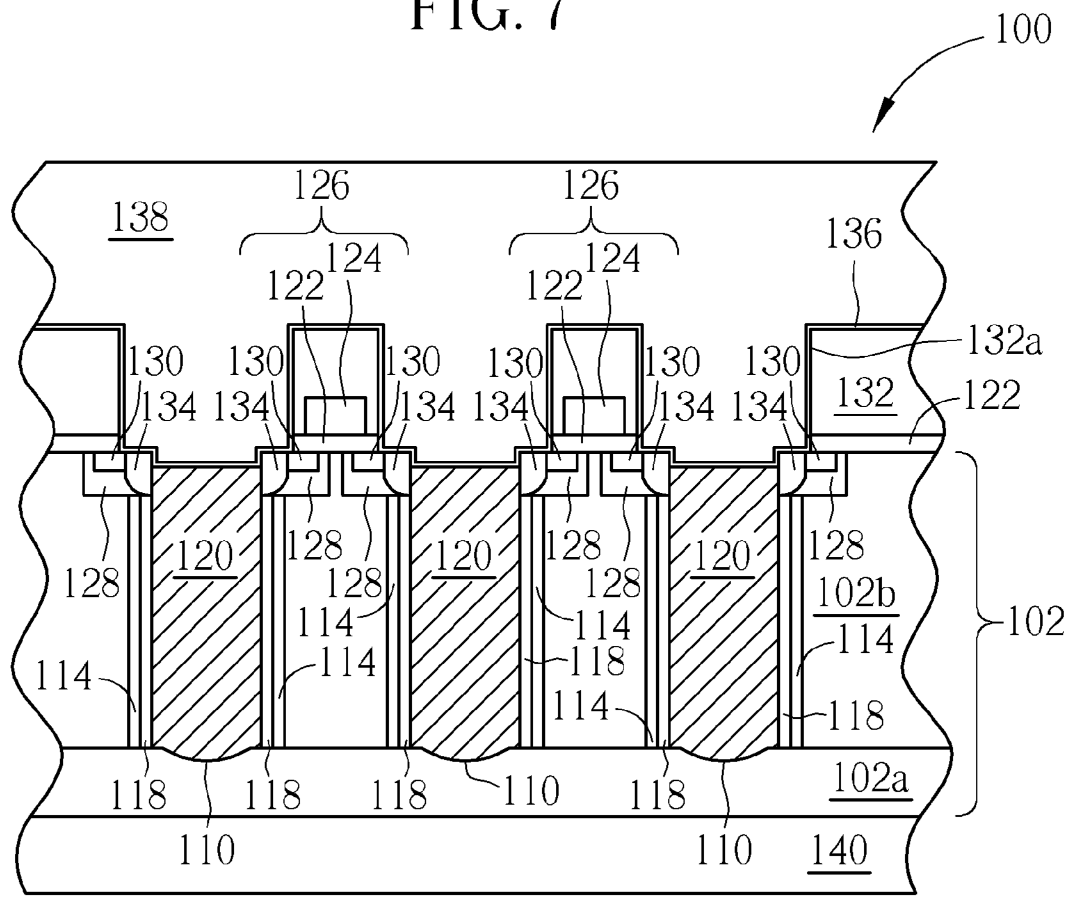

Next, as shown in FIG. 8, a dielectric layer 132, ex. a silicon oxide layer, is covered on the gate structure 126 and insulating layer 120. Another photolithographic process and etching process are performed to form a plurality of contact holes in the dielectric layer 132 and to remove a part of gate insulator layer 122 and insulating layer 120. The N-type doped source region 130 and the P-type doped base region 128 are exposed from each contact hole 132*a*. Next, another P-type ion implantation process and thermal drive-in process are carried out to form a P-type doped contact region 134 in each P-type doped base region 128 for lowering the source resistance. Then, another deposition process is performed to cover a barrier layer 136, ex. Ti or TiN, on the dielectric layer 132 and the sidewall and bottom of the contact hole 132*a*. Next, a source metal layer 138 is formed on the barrier layer 136. The source metal layer 138 may fill up the contact hole 132*a* and cover the dielectric layer 132. Furthermore, a drain metal layer 140 is formed under the N-type semiconductor substrate 102. At this stage, the power transistor device 100 of this embodiment is completed. In this embodiment, the step of forming a source metal layer 138 and a drain metal layer 140 may respectively include a plasma sputtering process or an electron beam deposition process, and the material of the source metal layer 138 and the drain metal layer 140 may respectively include the metal such as Ti, TiN, Al, W or the metal compound, but not limited thereto.

Figure 9:
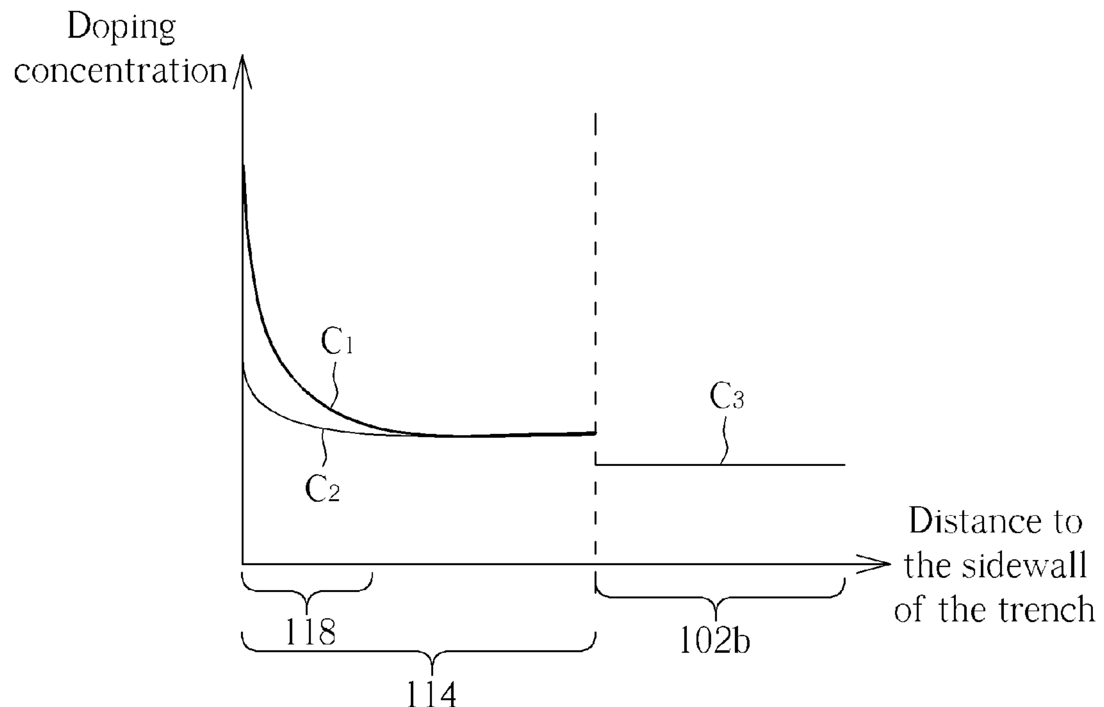
FIG. 9 is a graph illustrating the relation of the doping concentration of each P-type doped diffusion region and N-type semiconductor substrate vs. the distance to the sidewall of each trench.

In following description, the efficacy of using an N-type tilt-angle ion implantation process and a second thermal drive-in process to lower the doping concentration of each P-type doped diffusion region close to the sidewall of each trench will be further explained. Please refer to FIG. 9, which is a graph illustrating the relation between the doping concentration of each P-type doped diffusion region and a distance between each P-type doped diffusion region and the sidewall of each trench and the relation between the N-type semiconductor substrate and the distance between the N-type semiconductor substrate and the sidewall of each trench. As shown in FIG. 9, a curve $C_1$ is the relationship curve between the doping concentration of each P-type doped diffusion region and the distance between each P-type doped diffusion region and the sidewall of each trench before the N-type tilt-angle ion implantation process and the second thermal drive-in process. A curve $C_2$ is the relationship curve between the doping concentration of each P-type doped diffusion region and the distance between each P-type doped diffusion region and the sidewall of each trench after the N-type tilt-angle ion implantation process and the second thermal drive-in process. A curve $C_3$ is the relationship curve between the doping concentration of N-type semiconductor substrate and the distance between the N-type semiconductor and the sidewall of each trench. It is obvious to understand from the graph that the doping concentration of each P-type doped diffusion region close to the sidewall of each trench may be lowered to a level close to that of the doping concentration of each P-type doped diffusion region far from the sidewall of each trench by performing the N-type tilt-angle ion implantation process and the second thermal drive-in process, so that the super junction constituted by each P-type doped diffusion region and each N-type doped diffusion region may have an uniform distribution ratio of hole and electron concentration, thereby solving the problem of poor voltage withstanding ability of conventional super junctions. The doping concentration and the doping depth of the N-type tilt-angle ion implantation process and the heating time of the second thermal drive-in process in the present invention may vary depending on the ability of voltage withstanding of the super junction to be formed.

In other embodiments of present invention, the P-type doped diffusion region may be formed by a tilt-angle ion implantation process and the first thermal drive-in process, so that the doping concentration of the P-type doped diffusion region close to the sidewall of each trench may be lower than the doping concentration of the P-type doped diffusion region far from the sidewall of each trench. Thus, when the doping concentration of the P-type doped diffusion region close to the sidewall of each trench is lower than the doping concentration of the P-type doped diffusion region far from the sidewall of each trench, the tilt-angle ion implantation process may be a P-type tilt-angle ion implantation process so as to implant a plurality of P-type dopants into the P-type doped diffusion region close to the sidewall of each trench. Furthermore, after the second thermal drive-in process, a concentration increasing region will be formed in the P-type diffusion region close to the sidewall of each trench, and the doping concentration of the P-type diffusion region close to the sidewall of each trench will be increased to the level close to the doping concentration of the P-type diffusion region far from the sidewall of each trench. In this manner, if the doping concentration of the P-type diffusion region close to the sidewall of each trench is too low, the P-type tilt-angle ion implantation process and second thermal drive-in process may be used to increase the doping concentration of the P-type diffusion region close to the sidewall of each trench, so that the super junction may have an uniform distribution ratio of hole and electron concentration.

Figure 10:
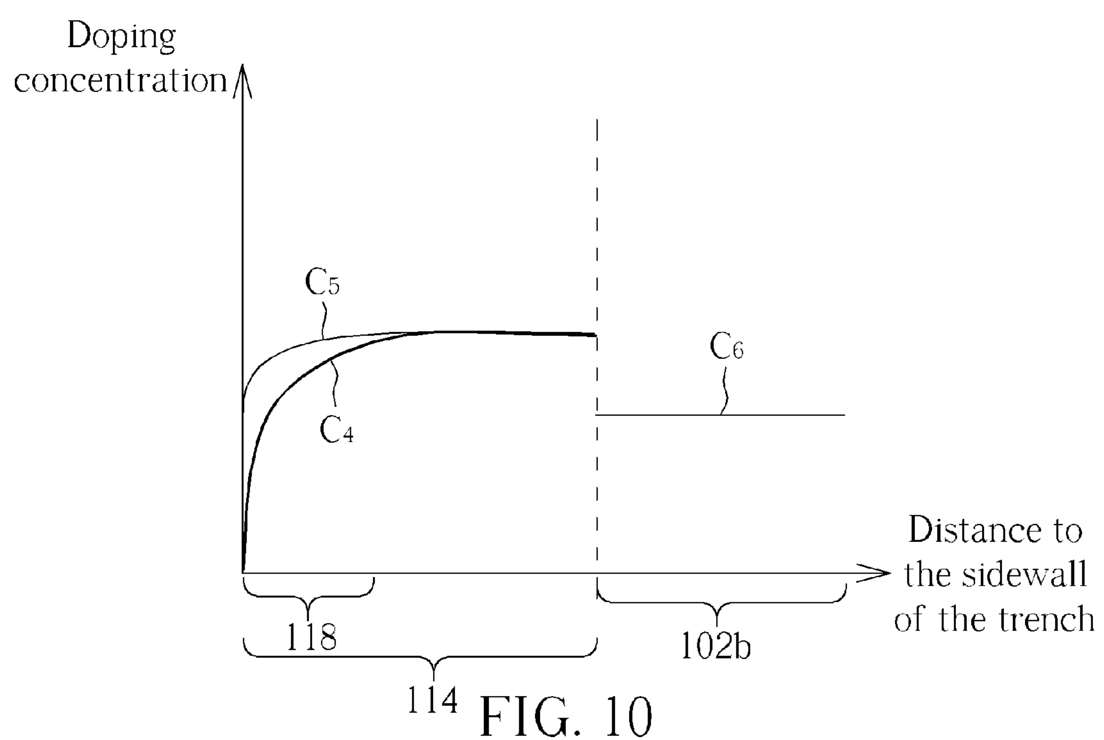
FIG. 10 is a graph illustrating the relation of the doping concentration of each P-type doped diffusion region and N-type semiconductor substrate vs. the distance to the sidewall of each trench.

In the following description, the efficacy of using a P-type tilt-angle ion implantation process and a second thermal drive-in process to increase the doping concentration of each P-type doped diffusion region close to the sidewall of each trench will be further explained. Please refer to FIG. 10, which is a graph illustrating the relation between the doping concentration of each P-type doped diffusion region and N-type semiconductor substrate and a distance between each P-type doped diffusion region and the sidewall of each trench. As shown in FIG. 10, a curve $C_4$ is the relationship curve between the doping concentration of each P-type doped diffusion region and the distance between each P-type doped diffusion region and the sidewall of each trench before the P-type tilt-angle ion implantation process and the second thermal drive-in process. A curve $C_5$ is the relationship curve between the doping concentration of each P-type doped diffusion region and the distance between each P-type doped diffusion region and the sidewall of each trench after the P-type tilt-angle ion implantation process and second thermal drive-in process. A curve $C_6$ is the relationship curve between the doping concentration of the N-type semiconductor substrate and the distance between the N-type semiconductor and the sidewall of each trench. It is obvious to understand from the graph that the doping concentration of each P-type doped diffusion region close to the sidewall of each trench may be increased by performing the P-type tilt-angle ion implantation process and the second thermal drive-in process, so that the super junction constituted by each P-type doped diffusion region and N-type doped diffusion region may have an uniform distribution ratio of hole electron concentration, thereby solving the problem of poor voltage withstanding ability of conventional super junctions. The doping concentration and the doping depth of the P-type tilt-angle ion implantation process and the heating time of the second thermal drive-in process in the present invention may vary depending on the ability of voltage withstanding of the formed super junction.

The manufacturing method of the power transistor device of the present invention is not limited to the aforementioned embodiment. Alternative embodiments and modifications of present invention will be further disclosed hereafter. In order to simplify the description and highlight the differences between the various embodiments or the modifications, similar reference numbers will be used to describe same components, and similar description will not be repeated again in the following paragraph.

Figure 11:
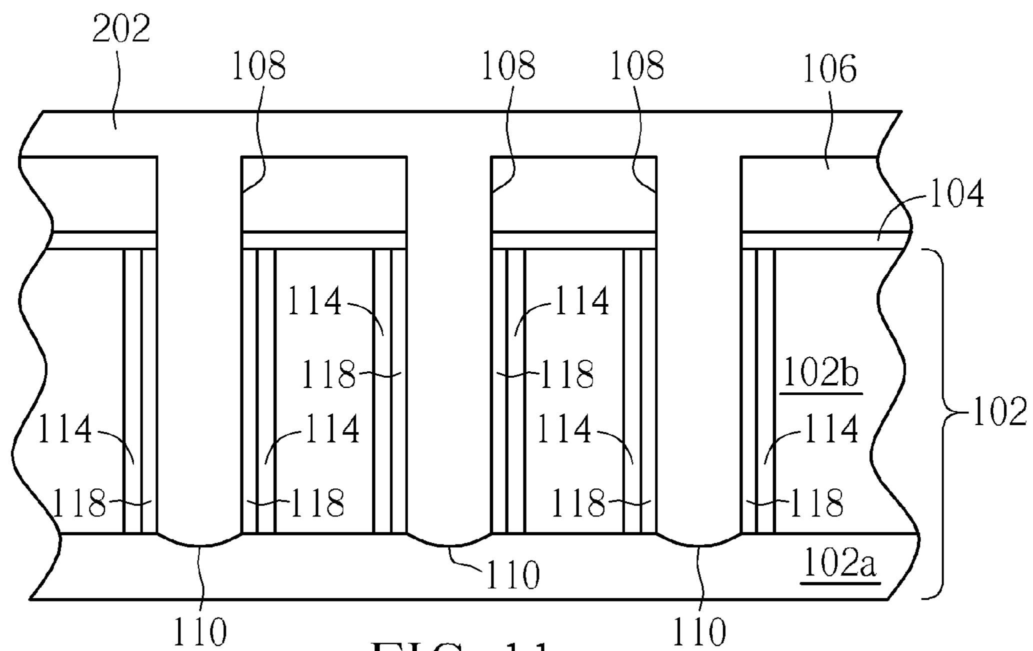
FIGS. 11 and 12 illustrate the manufacturing method of the super junction structure in accordance with another embodiment of the present invention.
Figure 12:
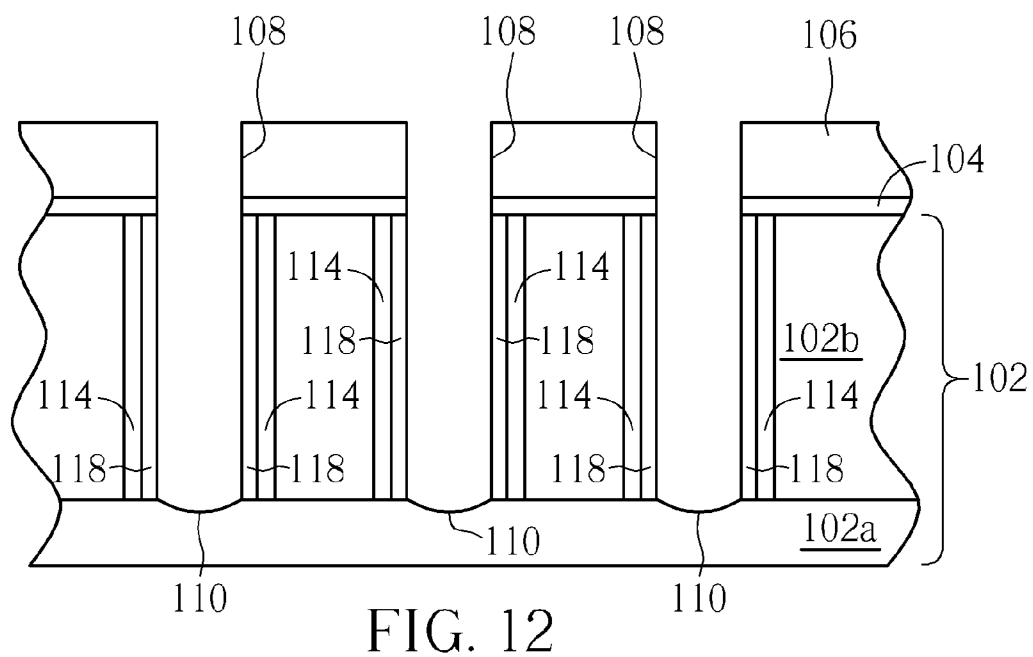

Please refer to FIGS. 11 and 12, and also refer to FIGS. 1, 2 and 4-8. FIGS. 11 and 12 illustrate the manufacturing method of the super junction structure in accordance with another embodiment of the present invention. In comparison to the aforementioned embodiment, the manufacturing method of this embodiment uses a second dopant source layer to adjust the doping concentration of the P-type doped diffusion region. The steps of the manufacturing method before the forming of P-type doped diffusion region in this embodiment are identical to the ones in aforementioned embodiment. Thus, as shown in FIG. 1 and FIG. 2, the doping concentration of each P-type doped diffusion region close to the sidewall of each trench in this embodiment is higher than the doping concentration of each P-type doped diffusion region far from the sidewall of each trench. Next, as shown in FIG. 11, the first dopant source layer 112 is removed, and a doping concentration adjusting layer 202 is then filled into each trench, wherein the doping concentration adjusting layer 202 is made of a second dopant source layer including a plurality of second dopants. Next, a second thermal drive-in process is performed to diffuse the second dopants into the P-typo doped diffusion region 114 for adjusting the doping concentration of each P-type doped diffusion region 114 close to the sidewall of each trench 110. Then, as shown in FIG. 12, the doping concentration adjusting layer 202 is removed. The following steps of this embodiment are identical to those of the aforementioned embodiment, as shown in FIGS. 4-8, redundant detailed description is therefore omitted herein. In this embodiment, the conductivity type of second dopant source layer is N-type, so the conductivity type of the second dopants is N-type and the concentration adjusting region 118 will be formed in each P-type doped diffusion region 114 close to the sidewall of each trench 110. Moreover, the material of the second dopant source layer may include arsenic silicate glass (ASG) or phosphor silicate glass (PSG), but not limited thereto. The material of the first dopant source layer and the second dopant source layer in the present invention are decided depending on the conductivity type of the first dopants and the second dopants included therein. For example, when the first conductivity type is N-type and the second conductivity type is P-type, the material of the first dopant source layer 112 may include boron-silicate glass (BSG) and the material of the second dopant source layer may include arsenic silicate glass (ASG) or phosphor silicate glass (PSG). When the first conductivity type is P-type and the second conductivity type is N-type, the material of the first dopant source layer 112 may include arsenic silicate glass (ASG) or phosphor silicate glass (PSG), and the material of the second dopant source layer may include boron-silicate glass (BSG), but not limited thereto.

Furthermore, since the conductivity type of the N-type second dopants implanted into each P-type doped diffusion region 114 is different from the one of P-type first dopants of each P-type doped diffusion region 114, the N-type first dopants will be neutralized by a part of the P-type first dopants of each P-type doped diffusion region 114 in each concentration adjusting region 118, so that the doping concentration of the P-type first dopant in each concentration adjusting region 118 may be adjusted to the level close to the doping concentration of the P-type first dopant in each P-type doped diffusion region 114. In this manner, if the doping concentration of the P-type diffusion region close to the sidewall of each trench is too high, the doping concentration of each P-type doped diffusion region 114 close to the sidewall of each trench 110 may be lowered to a level close to the doping concentration of each P-type doped diffusion region 114 far from the sidewall of each trench 110, so that the super junction constituted by each P-type doped diffusion region and N-type doped diffusion region may have an uniform distribution ratio of hole and electron concentration, thereby solving the problem of poor voltage withstanding ability of conventional super junctions.

In other embodiments of the present invention, the materials of the doping concentration adjusting layer may comprise undoped materials such as monocrystalline silicon, polycrystalline silicon, amorphous silicon, or silicon oxide, so that the P-type first dopants in each P-type doped diffusion region close to the sidewall of each trench may be diffused into the doping concentration adjusting layer, thereby lowering the doping concentration of the P-type doped diffusion region close to the sidewall of each trench.

Besides, in other embodiments of the present invention, when the doping concentration of the P-type doped diffusion region close to the sidewall of each trench is lower than the doping concentration of the P-type doped diffusion region far from the sidewall of each trench, the conductivity type of the second dopants in the second dopant source layer may be P-type. Thus, the material of the second dopant source layer and the material of the first dopant source layer may be the same, such as boron-silicate glass (BSG), but not limited thereto. In this manner, if the doping concentration of P-type diffusion region close to the sidewall of each trench is too low, the P-type tilt-angle ion implantation process and the second thermal drive-in process may be performed to form the concentration increasing region in each P-type doped diffusion region close to the sidewall of each trench and increase the doping concentration of each P-type doped diffusion region close to each trench, so that the formed super junction will have an uniform distribution ratio of hole and electron concentration.

To summarize, the present invention uses tilt-angle ion implantation processes or doping concentration adjusting layers filled in trenches combined with a thermal drive-in process, to lower the doping concentration of each doped diffusion region close to each trench when the concentration is too high, or to increase the doping concentration of each doped diffusion region close to each trench when the concentration is too low, so that the super junction constituted by each doped diffusion region and N-type doped diffusion region may have an uniform distribution ratio of hole and electron concentration, thereby solving the problem of poor voltage withstanding ability of conventional super junctions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a power transistor device with a super junction, comprising:

providing a semiconductor substrate of a first conductivity type;

forming at least one trench in said semiconductor substrate;

filling a dopant source layer into said trench, wherein said dopant source layer comprises a plurality of dopants of a second conductivity type different from said first conductivity type;

performing a first thermal drive-in process to diffuse said dopants into said semiconductor substrate, so as to form two doped diffusion regions in said semiconductor substrate at both sides of said trench, wherein the doping concentration of each said doped diffusion region close to the sidewall of said trench is different from the doping concentration of each said doped diffusion region far from the sidewall of said trench;

removing said dopant source layer; and performing a tilt-angle ion implantation process and a second thermal drive-in process to adjust the doping concentration of each said doped diffusion region close to the sidewall of said trench.

2. The manufacturing method of a power transistor device with a super junction according to claim 1, wherein the doping concentration of each said doped diffusion regions close to the sidewall of said trench is larger than the doping concentration of each said doped diffusion regions far from the sidewall of said trench, and said tilt-angle ion implantation process is performed to implant a plurality of said dopants of said first conductivity type into each said doped diffusion regions close to the sidewall of said trench.

3. The manufacturing method of a power transistor device with a super junction according to claim 1, wherein said second conductivity type is P-type, and the material of said dopant source layer comprises boron-silicate glass (BSG).

4. The manufacturing method of a power transistor device with a super junction according to claim 1, wherein said second conductivity type is N-type, and the material of said dopant source layer comprises arsenic silicate glass (ASG) or phosphor silicate glass (PSG).

5. The manufacturing method of a power transistor device with a super junction according to claim 1, wherein said manufacturing method after the step of said tilt-angle ion implantation process and said second thermal drive-in process further comprises:

forming an insulating layer in said trench;

forming gate structure on said semiconductor substrate at at least one side of said trench;

forming two doped base regions of said second conductivity type respectively in said semiconductor substrate at both sides of said gate structure, and each said doped base region contacts one said doped diffusion region; and forming a doped source region in each said doped base region.

6. A manufacturing method of a power transistor device with a super junction, comprising:

providing a semiconductor substrate of a first conductivity type;

forming at least one trench in said semiconductor substrate;

filling a first dopant source layer into said trench, wherein said first dopant source layer comprises a plurality of first dopants of a second conductivity type different from said first conductivity type;

performing a first thermal drive-in process to diffuse said first dopants into said semiconductor substrate, so as to form two doped diffusion regions respectively in said semiconductor substrate at both sides of said trench, wherein the doping concentration of each said doped diffusion region close to the sidewall of said trench is different from the doping concentration of each said doped diffusion region away from the sidewall of said trench;

removing said first dopant source layer;

filling a doping concentration adjusting layer in said trench and performing a second thermal drive-in process to adjust the doping concentration of said doped diffusion region close to the sidewall of said trench; and removing said doping concentration adjusting layer.

7. The manufacturing method of a power transistor device with a super junction according to claim 6, wherein said doping concentration adjusting layer is made of a second dopant source layer, and said second dopant source layer comprises a plurality of second dopants of said first conductivity type.

8. The manufacturing method of a power transistor device with a super junction according to claim 7, wherein said first conductivity type is N-type, said second conductivity type is P-type, the material of said first dopant source layer comprises boron-silicate glass (BSG), and the material of said dopant source layer comprises arsenic silicate glass (ASG) or phosphor silicate glass (PSG).

9. The manufacturing method of a power transistor device with a super junction according to claim 7, wherein said first conductivity type is P-type, said second conductivity type is N-type, the material of said first dopant source layer comprises arsenic silicate glass (ASG) or phosphor silicate glass (PSG), and the material of said dopant source layer comprises boron-silicate glass (BSG).

10. The manufacturing method of a power transistor device with a super junction according to claim 6, wherein said doping concentration adjusting layer is made of a second dopant source layer, and said second dopant source layer comprises a plurality of second dopants of said second conductivity type.

11. The manufacturing method of a power transistor device with a super junction according to claim 10, wherein said second conductivity type is P-type, and the material of said first dopant source layer and said second dopant source layer comprises boron-silicate glass (BSG).

12. The manufacturing method of a power transistor device with a super junction according to claim 10, wherein said second conductivity type is N-type, and the materials of said first dopant source layer and said second dopant source layer respectively comprise arsenic silicate glass (ASG) or phosphor silicate glass (PSG).

13. The manufacturing method of a power transistor device with a super junction according to claim 6, wherein the material of said doping concentration adjusting layer comprises monocrystalline silicon, polycrystalline silicon, amorphous silicon, or silicon oxide.

14. The manufacturing method of a power transistor device with a super junction according to claim 6, wherein said manufacturing method after the step of removing said doping concentration adjusting layer further comprises:

forming an insulating layer in said trench;

forming a gate structure on said semiconductor substrate at at least one side of said trench;

forming two doped base regions of said second conductivity type in said semiconductor substrate respectively at both sides of said gate structure, wherein each said doped base region contacts each said doped diffusion region; and forming a doped source region in each said doped base region.

* * * * *